United States Patent [19]

Armstrong et al.

[11] Patent Number: 5,347,215
[45] Date of Patent: Sep. 13, 1994

[54] SEMICONDUCTOR CHIP TEST JIG

[75] Inventors: Ross L. Armstrong, Meadowpark; George A. Meiklejohn, Bellevue Crescent, both of United Kingdom

[73] Assignee: Digital Equipment International Ltd., Switzerland

[21] Appl. No.: 900,631

[22] Filed: Jun. 18, 1992

[30] Foreign Application Priority Data

Jun. 27, 1991 [GB] United Kingdom ............... 9114076.4

[51] Int. Cl.⁵ .............................................. G01R 1/04
[52] U.S. Cl. .................... 324/158.1; 324/761; 439/72; 439/68; 439/70
[58] Field of Search ............ 324/158 F, 158 P; 439/70, 72, 68

[56] References Cited

U.S. PATENT DOCUMENTS

| | | | |
|---|---|---|---|
| 3,377,514 | 4/1968 | Ruehlemann et al. | 439/68 |
| 3,454,921 | 7/1969 | Coleman et al. | 324/158 F |
| 4,839,587 | 3/1988 | Flatby et al. | 324/158 F |
| 5,154,619 | 10/1992 | Matsuoka | 439/72 |

FOREIGN PATENT DOCUMENTS 0197477  5/1981  Japan ................ 324/158 F

Primary Examiner—Kenneth A. Wieder
Assistant Examiner—Barry C. Bowser
Attorney, Agent, or Firm—Krishnendu Gupta; Ronald C. Hudgens; Albert P. Cefalo

[57] ABSTRACT

A semiconductor chip test jig for testing a chip 10 with "gull-wing" leads 11 comprises a body 20 and a cover 30. The body 20 has sets of fins or combs 23 which engage with the leads 11 to locate the chip 10 in the horizontal plane; the cover 30 has a set of "knife-edge" lead supports 35 formed to match a trim and form jig in the region of the leads 11 from where they emerge from the encapsulation of the chip 10 to their first bends; and the body 20 has a set of spring-loaded pins 24 which contact the leads opposite the lead supports.

12 Claims, 2 Drawing Sheets

SEMICONDUCTOR CHIP TEST JIG

Background

This invention is concerned with testing semiconductor packages, and more particularly (though not exclusively) with those with "gull-wing" (i.e. cranked or Z-shaped) leads.

A standard form of chip package has "gull-wing" leads. Such a chip is initially formed with flat leads (i.e. leads in the plane of the chip), and encapsulated in that form. The chip is then placed in a "trim and fit" jig, which is a mechanical press which trims off excess lead length and bends the leads into a "gull-wing" shape; that is, a cranked or Z shape with a bend downwards soon after emerging from the encapsulation and then a second bend back into the horizontal at a level slightly below the bottom surface of the encapsulation. The chip is then ready for surface mounting or soldering onto a printed circuit board (PCB).

In producing electronic systems, testing is performed at many different stages. In particular, semiconductor chips undergo repeated testing during their manufacture, including being tested after assembly or encapsulation. The PCBs on which they are to be mounted are also tested at various stages, including after the chips have been mounted on them. This testing obviously tests the functions of the chips (though in the context of the whole PCB rather than in isolation). More precisely, the final test of a chip before mounting on a PCB is normally performed immediately before the trim and fit stage. This is because the chip can conveniently be placed in a testing jig while its pins are flat.

Testing of chips after the trim and fit stage has generally not been attempted, because it has been regarded as both difficult and superfluous.

The difficulty is that to make satisfactory contact with the chip leads after they have been bent into the gull-wing shape, fairly high forces are required. These are liable to distort the shape of the leads, so that the chip cannot then be soldered satisfactorily to its PCB. (The lead alignment is required to be maintained to within 75 microns.)

The superfluity arises because the trim and fit process is a purely mechanical process acting only on the portions of the leads exterior to the chip. There is therefore no mechanism by which it can affect the electrical characteristics of the chip.

We have realized, however, that for several reasons, it is desirable also to be able to test a chip after trim and fit, i.e. with "gull-wing" leads.

Although the trim and form process does not act directly on the body of the chip, the mechanical forces involved in cutting and shaping the leads may nevertheless be transmitted into that body, and may therefore affect its mechanical integrity.

In some cases the chip may undergo further processing (e.g. the attachment of a heat sink or devices such as capacitors) between trim and fit and soldering onto the PCB.

A chip may be stored for a considerable length of time (of the order of a year) before being used, and if a chip has been stored for an extended time, it is desirable to test it again before using it. Also, the requirements for the chip may have changed slightly (e.g. bus speed requirements may have been defined more tightly), so it may be desirable to test old chips to see whether they conform to the latest requirements. In addition, if a manufacturing problem is identified after chip production has started, it may be desirable or necessary to test the chips which have already been made.

Finally, if a PCB with a chip attached is found to be faulty, it is often desirable to remove the chip, test it, and replace it on the PCB if it is found to be sound.

THE INVENTION

To achieve such testing without risking distortion of the leads, we provide a semiconductor chip test jig comprising:
locating means for locating a chip in the horizontal plane;
a set of "knife-edge" lead supports formed to match a trim and form jig in the region of the leads adjacent to where they emerge from the encapsulation; and
a set of spring-loaded pins which contact the leads opposite the lead supports.

Preferably the locating means includes fins or combs with which the chip leads mate. These fins or combs preferably engage with only the inner parts of the leads, i.e. with the initial horizontal portions emerging from the encapsulation and possibly also with the downward portions following those bends, but not the outermost portions following the bends back into the horizontal. They may be formed as part of a carrier which supports the set of spring-loaded pins.

The outer ends of the leads are not restrained or subject to any significant forces, since the only physical contacts with the chip are the sideways forces which merely locate it horizontally, and the forces of the "knife-edge" lead supports (which match those which were used to shape the leads into the "gull-wing" form) and of the spring-loaded pins, which act on the leads at points where they are rigidly supported from behind by the "knife-edge" supports. The present apparatus therefore causes substantially no distortion of the outer ends of the leads.

A semiconductor chip test jig embodying the invention and modifications thereof will now be described, by way of example, with reference to the drawings, in which.

Figure 1:
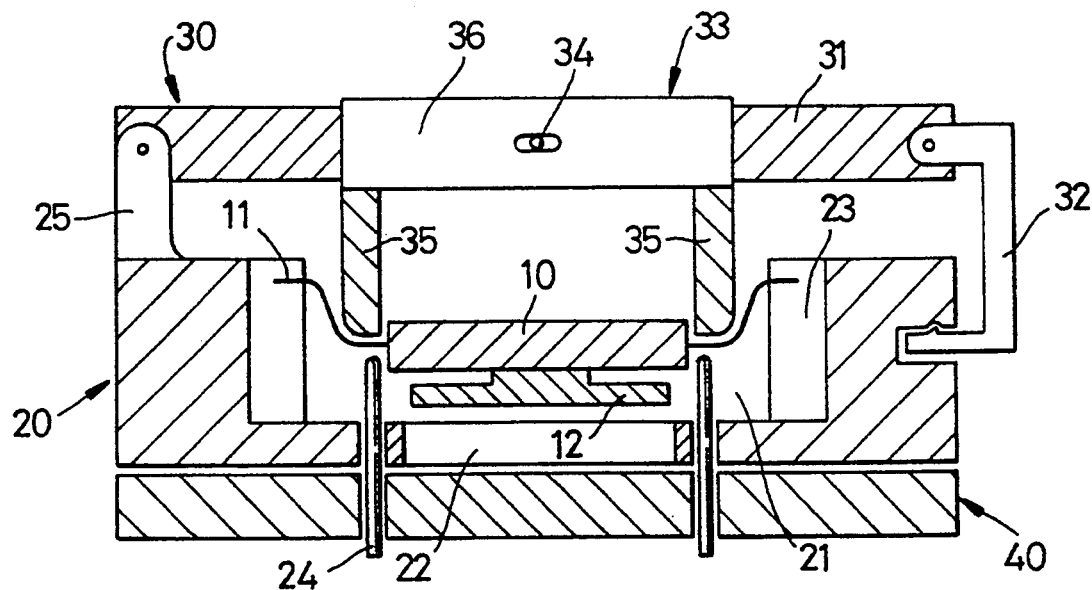
FIG. 1 is a diagrammatic section through the jig.

FIG. 1 shows a test jig or socket for testing a chip 10. The chip has "gull-wing" leads 11 which emerge horizontally from the body of the chip, and then have a first upwards bend followed by a second downwards bend to bring the outer ends of the leads back to the horizontal. (The chip is shown in the "dead bug" or "feet up" orientation.) The chip also has a heat sink 12 attached to it.

The jig comprises two major parts, a body 20 and a cover 30.

The body 20 has a central square well 21 with a hole 22 in its bottom; as shown, the chip 10 is placed in this well, and if the chip has an extended heat sink, that can project down through the hole 22. On each side of the well 21 there is a comb or set of fins 23. The outer ends of the leads 11 lie between the fins 23 as shown. These fins therefore locate the chip horizontally. The body 20 also carries a set of spring-loaded pins 24.

The cover 30 includes a plate 31 which is hinged at one side to a projection 25 on the body 20, and has at its other side a hinged catch 32 which can engage with the body 20 as shown, so locking the plate 31 in position.

The cover also includes a pressure body 33, which is hinged or gimballed, as shown at 34, to the cover plate 31 in a manner which allows a limited horizontal movement or "float" of the body 33. The pressure body 33 consists of four vertical sides 35 joined along their vertical edges to form an open box shape, and two upper side plates 36 forming upwards extensions of two of the sides 35 and by which the pressure body is hinged to the cover 31.

The bottom edges of the four sides 35 of the pressure body 33, forming the bottom rim of the "box", are formed to match the corresponding parts of a trim and forth jig for the chip 10. The inner horizontal parts of the leads 11 and their upward curves thus closely match the bottom edges of the sides 35.

A PCB 40 is attached to the underside of the body 20, and has the lower ends of the pins 24 attached to it. This PCB thus provides contacts to the pins. If desired, at least some of the test circuitry for testing the chip 10 can be mounted on the PCB.

In use, the chip 10 is placed in the jig as shown. When the pressure body 33 is engaged, it presses the chip 10 downwards, by the sides 35 of the "box" pressing on the leads 11 of the chip, bringing the leads into engagement with the spring-loaded pins 24. Since the bottom edges of the plates 35 of the pressure body match the trim and form jig in which the chip leads were shaped, the pressure body will not cause any deformation of the leads; and since the pins 24 contact these leads at points directly opposite where they are supported by the pressure body, the contact forces of the pins will not cause any deformation of the leads.

Figure 2:
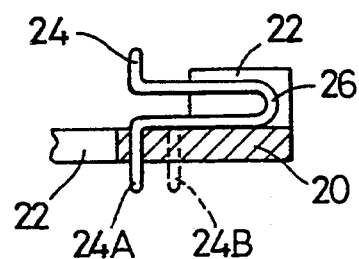
FIGS. 2 to 4 are partial diagrammatic sections through modifications thereof.

FIG. 2 shows a modified form of pin carrier, in which each pin is formed with a U 26 in it, giving the required springiness The pins are preferably separated laterally by fins 23. The lower parts of the Us of the pins can be alternately long and short, so that their outer ends are staggered as indicated at 24A and 24B and thereby more widely spaced.

Figure 3:
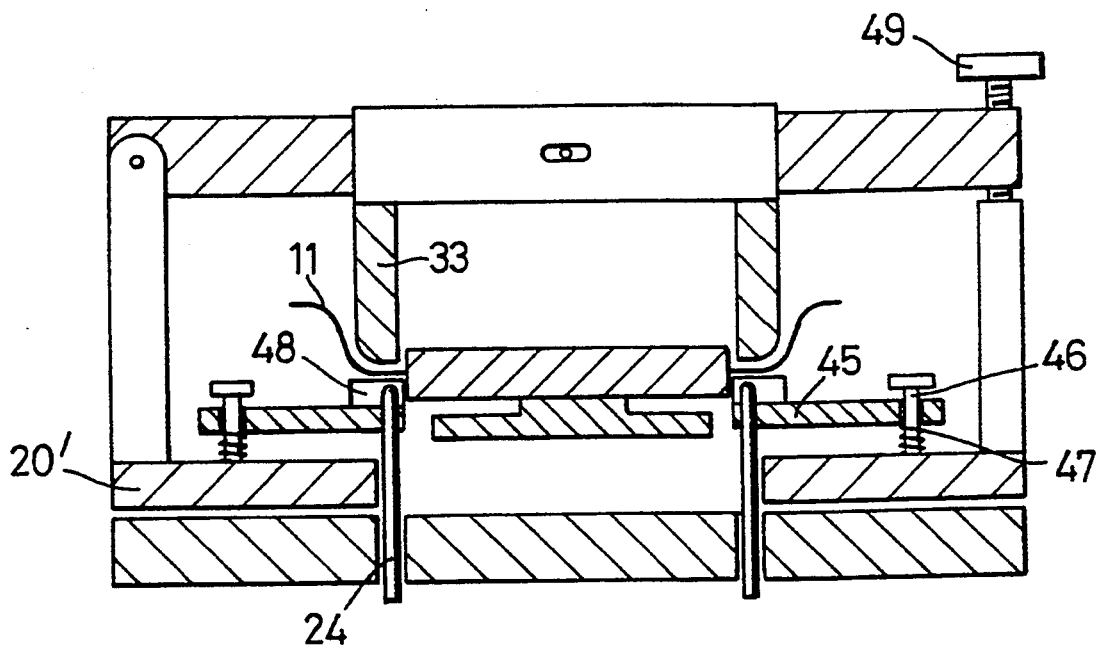

FIG. 3 shows a modified form of jig in which the main body 20' carries a plate 45 having low combs or fins 48 formed on it. The plate 45 is mounted on vertical guide rods 46 so that it can "float" on the main body 20, spring-loaded against the pressure body 33 by springs 47. This allows the combs 48 to be shallower, so that the leads 11 do not have to slide down between their fins so much, and also allows the combs to engage with the inner rather than the outer parts of the leads. A threaded screw catch 49 is used in place of the catch 32 of FIG. 1.

The leads of the chip will lie between the fins 48 before the pressure body 33 is brought down onto the chip. As the pressure body is brought into contact with the leads, so the fins will be pushed downwards, so that the leads lie between their upper edges. For clarity, the plate 45 is shown depressed slightly below this position, although in practice it will never be that low.

Figure 4:
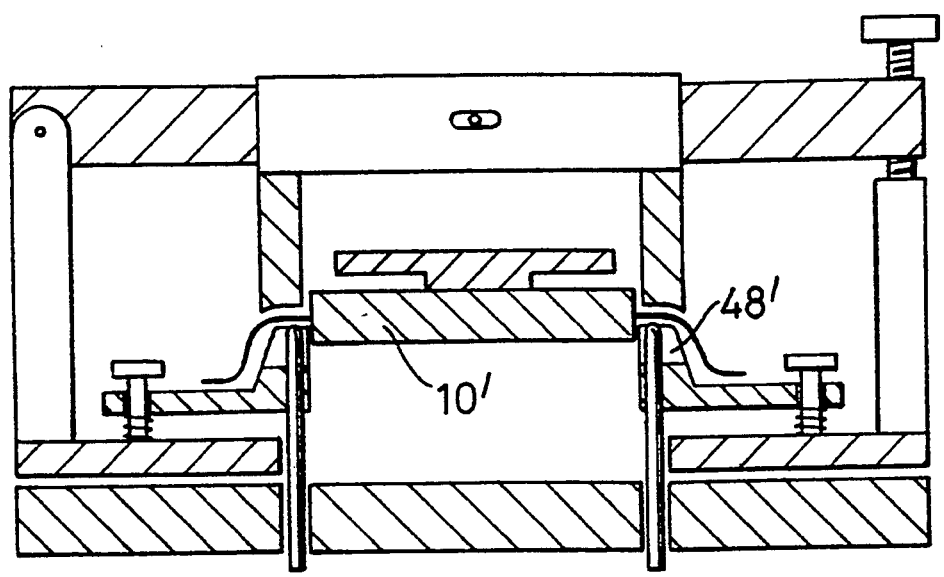

FIG. 4 shows a further modified form of jig in which the chip 10' is held in the "live bug" (feet down) position. For this, the fins 48' have to be larger than the fins 48 in the FIG. 3 jig.

It will be realized that although the invention has been developed particularly for use with chips with gull-wing leads, the principles are not limited to this lead shape, and can equally be applied to chips with straight leads.

We claim:

1. A test jig for leaded semi-conductors comprising:
   a body including a bottom and side walls, said side walls extending laterally away from said bottom to form a well space region therebetween for housing a leaded semiconductor during testing; the bottom having openings extending therethrough;
   resiliently biased contact pins extending through the openings for supporting contact with the leads of said semiconductor;
   fins located in the well space region extending inwardly of two opposing side walls towards a central region of said well for locating leads of said semi-conductor in alignment with said contact pins for support on the the ends thereof; said leads of said semiconductor being placed between said fins; and
   a cover comprising holding surfaces positioned to contact said leads at directly opposite locations on said leads when said body and and cover are brought together.

2. The apparatus of claim 1 wherein said contact pins are spring loaded.

3. The apparatus of claim 1 wherein said leads are curved and wherein said holding surfaces are shaped to match the curve in the leads in the location of contact.

4. The apparatus of claim 1 wherein said fins engage with only the inner parts of the leads.

5. The apparatus of claim 1 wherein said cover is carried on a floating mount.

6. A test jig for leaded semi-conductor comprising:
   a body including a bottom and side walls, said side walls extending laterally away from said bottom to form a well space region therebetween for housing a leaded semiconductor during testing; the bottom having openings extending therethrough;
   resiliently biased contact pins extending through the openings for supporting contact with the leads of said semiconductor;
   fins located in the well space region; adjacent fins forming a guide space therebetween; the guide spaces being positioned for alignment receipt of the leads of the semiconductor placed in the well space region of the jig for testing; and
   a cover comprising holding surfaces positioned to contact said leads at directly opposite locations on said leads when said body and and cover are brought together.

7. The apparatus of claim 6 wherein said contact pins are spring loaded.

8. The apparatus of claim 6 wherein said leads are curved and wherein said holding surfaces are shaped to match the curve in the leads in the location of contact.

9. The apparatus of claim 6 wherein said fins engage with only the inner parts of the leads.

10. The apparatus of claim 6 wherein said fins are attached to two opposing side walls of said well space region extending inwarldly towards a central region of said well.

11. The apparatus of claim 6 wherein said cover is carried on a floating mount.

12. The apparatus of claim 6 wherein the fins located in the well space region are formed on plates; each of said plates being mounted on spring-loaded vertical guide rods.

* * * * *